US010461281B2

United States Patent
Lin et al.

(10) Patent No.: US 10,461,281 B2
(45) Date of Patent: Oct. 29, 2019

(54) LIGHT EMITTING DEVICE

(71) Applicant: Industrial Technology Research Institute, Hsinchu (TW)

(72) Inventors: Hsuan-Yu Lin, Changhua County (TW); Ting-Yu Wang, Kaohsiung (TW); Wen-Hung Liu, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 16/178,617

(22) Filed: Nov. 2, 2018

(65) Prior Publication Data
US 2019/0305258 A1    Oct. 3, 2019

(30) Foreign Application Priority Data
Mar. 30, 2018    (TW) .............................. 107111083 A

(51) Int. Cl.
*H01L 51/56*    (2006.01)
*H01L 51/50*    (2006.01)
*H01L 51/52*    (2006.01)

(52) U.S. Cl.
CPC .......... *H01L 51/56* (2013.01); *H01L 51/5012* (2013.01); *H01L 51/524* (2013.01); *H01L 51/5209* (2013.01); *H01L 51/5225* (2013.01); *H01L 51/5253* (2013.01); *H01L 51/5259* (2013.01); *H01L 2251/5392* (2013.01); *H01L 2251/568* (2013.01)

(58) Field of Classification Search
CPC combination set(s) only.
See application file for complete search history.

(56) References Cited

U.S. PATENT DOCUMENTS

| 6,823,724 B1 | 11/2004 | Kobayashi et al. |
| 9,070,598 B2 | 6/2015 | Jin et al. |
| 2006/0088951 A1* | 4/2006 | Hayashi ............. H01L 51/5237 438/99 |

(Continued)

FOREIGN PATENT DOCUMENTS

| CN | 103928488 | 7/2014 |
| CN | 107764204 | 3/2018 |

(Continued)

OTHER PUBLICATIONS

"Office Action of Taiwan Counterpart Application," dated May 2, 2019, p. 1-p. 3.

(Continued)

*Primary Examiner* — Fernando L Toledo
*Assistant Examiner* — Valerie N Newton
(74) *Attorney, Agent, or Firm* — JCIPRNET

(57) ABSTRACT

A light emitting device including a substrate, a first electrode, a light emitting layer, a second electrode, a heat shrinkable film and a first adhesive layer is provided. The first electrode is disposed on the substrate. The light emitting layer is disposed on the first electrode. The second electrode is disposed on the light emitting layer. The first electrode, the light emitting layer, and the second electrode are sequentially stacked on the substrate to form a light emitting cell. The heat shrinkable film is disposed on the light emitting cell. The first adhesive layer is disposed between the heat shrinkable film and the second electrode.

21 Claims, 18 Drawing Sheets

(56) References Cited

U.S. PATENT DOCUMENTS

2011/0315977 A1* 12/2011 Murayama ............ H01L 51/448
                                                            257/40
2014/0168660 A1   6/2014  Yan et al.
2016/0012773 A1   1/2016  Lee et al.

FOREIGN PATENT DOCUMENTS

| EP | 2924760   | 9/2015 |
| JP | 2014017208 | 1/2014 |
| TW | 200923493 | 6/2009 |
| TW | I489101   | 6/2015 |
| TW | I516743   | 1/2016 |
| TW | I568989   | 2/2017 |
| TW | I585967   | 6/2017 |

OTHER PUBLICATIONS

"Office Action of Taiwan Counterpart Application," dated Feb. 25, 2019, p. 1-p. 7.

* cited by examiner

LIGHT EMITTING DEVICE

CROSS-REFERENCE TO RELATED APPLICATION

This application claims the priority benefit of Taiwan application serial no. 107111083, filed on Mar. 30, 2018. The entirety of the above-mentioned patent application is hereby incorporated by reference herein and made a part of this specification.

BACKGROUND

Technical Field

This disclosure is related to a light emitting device.

Background

The organic light emitting device has characteristics including a wide viewing angle, light weight, thinness with a hardware device, high luminous efficiency, and the like, and therefore its application field is wider and wider. However, the organic light emitting device is prone to a situation where the distribution of current is not uniform and current concentration or short-circuit is thus occurred in local areas. Once the current concentration or short-circuit point occurs, the crowded current at the short-circuit point will cause the temperature to rise, which will cause the organic light emitting layer to be deteriorated and the area of the short-circuit point to be enlarged by expanding the coking range. In addition, once the current concentration or short-circuit point occurs, the current will be concentrated to the short-circuit point, which causes the entire organic light emitting device to fail and cannot continue to emit a light.

SUMMARY

In one embodiment of this disclosure, the light emitting device comprises a substrate, a first electrode, a light emitting layer, a second electrode, a heat shrinkable film and a first adhesive layer. The first electrode is disposed on the substrate. The light emitting layer is disposed on the first electrode. The second electrode is disposed on the light emitting layer. The first electrode, the light emitting layer, and the second electrode are sequentially stacked on the substrate to form a light emitting cell. The heat shrinkable film is disposed on the light emitting cell. The first adhesive layer is disposed between the heat shrinkable film and the second electrode.

To make the present disclosure more apparent and easier to understand, the following embodiments are described in detail and in conjunction with the accompanying drawings as follows.

DESCRIPTION OF DISCLOSED EMBODIMENTS

Figure 1:
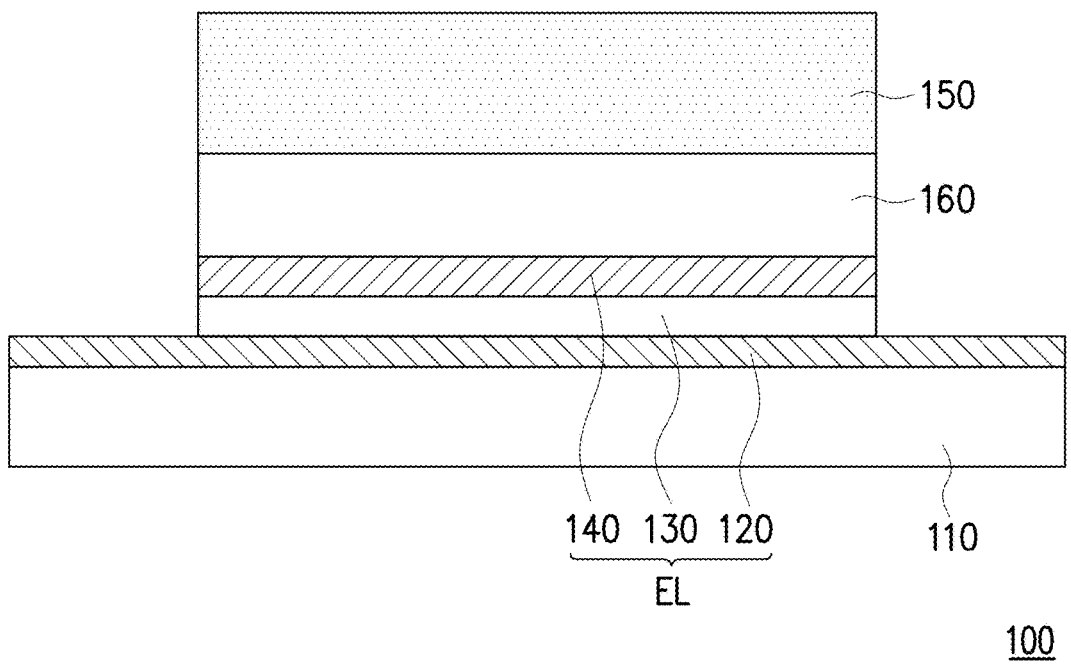
FIG. 1 is a schematic cross-sectional view of a light emitting device according to an embodiment of the present disclosure.

FIG. 1 is a schematic cross-sectional view of a light emitting device according to an embodiment of the present disclosure. In FIG. 1, the light emitting device 100 includes a substrate 110, a first electrode 120, a light emitting layer 130, a second electrode 140, a heat shrinkable film 150, and a first adhesive layer 160. The first electrode 120 is disposed on the substrate 110, the light emitting layer 130 is disposed on the first electrode 120, the second electrode 140 is disposed on the light emitting layer 130, and the heat shrinkable film 150 is disposed on the second electrode 140. The first electrode 120, the light emitting layer 130, and the second electrode 140 are sequentially stacked on the substrate 110 to form the light emitting unit EL. In addition, the first adhesive layer 160 is disposed between the heat shrinkable film 150 and the second electrode 140 to adhere the heat shrinkable film 150 to the light emitting unit EL.

The substrate 110 has sufficient support ability to carry the light emitting unit EL. The substrate 110 may be a light-transmitting substrate or an opaque substrate. When the substrate 110 allows transmitting light, the light emitted by the light emitting unit EL can be emitted from the substrate 110. When the substrate 110 does not transmit light, the light emitted by the light emitting unit EL may be emitted away from the substrate 110. For example, the substrate 110 may be a glass substrate, a plastic substrate, a metal substrate, a semiconductor substrate, or a composite substrate made of a plurality of materials.

The light emitting unit EL comprises a first electrode 120, a light emitting layer 130, and a second electrode 140 that are sequentially stacked, and each of the first electrode 120, the light emitting layer 130, and the second electrode 140 is a layered material, respectively. The light emitting layer 130 has an ability of electroluminescence, and the first electrode 120 and the second electrode 140 are used to provide power required to cause the light emitting layer 130 to emit light. The first electrode 120 and the second electrode 140 are made of a conductive material, such as a metal, a conductive oxide material, or an organic conductive material. The metal above may be silver, aluminum, indium, molybdenum, titanium, etc., or any alloys thereof, for example. The oxide above may be indium tin oxide, indium zinc oxide, zinc oxide, tin oxide, or antimony oxide, for example. The specific materials of the first electrode 120 and the second electrode 140 can be selected according to the required light transmittance, electrical properties and other factors. After the first electrode 120 and the second electrode 140 are applied with electricity, an electric current may flow through the light emitting layer 130, so that the light emitting layer 130 emits light. The material of the light emitting layer 130 includes an organic electroluminescent material, and the light emitting layer 130 may be a stacked layer formed by stacking a plurality of material layers. In some embodiments, the first electrode 120 may be formed on the substrate 110 by evaporation, sputtering or printing. The light emitting layer 130 may be formed on the first electrode 120 by vapor deposition or printing. The second electrode 140 may be formed on the light emitting layer 130 by vapor deposition or printing.

The heat shrinkable film 150 is a prestressed film and its material comprises polystyrene, polyvinyl chloride, polyester, polyolefinlx, polypropylene, polyethylene, and the like. The heat shrinkable film 150 may have a thickness of 10 μm (micrometers) to 400 μm. If considering that the light emitting layer 130 of the light emitting unit EL may be degraded under the influence of moisture, the heat shrinkable film 150 may be made of a material having a water vapor/oxygen barrier ability. For example, the water vapor transmission rate (WVTR) of the heat shrinkable film 150 may be less than $10^{-4}$ g/(m$^2$·day). The heat shrinkable film 150 has a characteristic that it shrinks when heated. In some embodiments, the heat shrinkable film 150 attached to the light emitting unit EL undergoes a volume shrinkage reaction at a temperature of 60° C. to 120° C. In addition, alternatively, the heat shrinkable film 150 attached to the light emitting unit EL has a volumetric shrinkage rate of 50% or more after being heated. When the heat shrinkable film 150 shrinks, the shrinkage stress can be transmitted to the light emitting unit EL through the first adhesive layer 160.

The first adhesive layer 160 is used for attaching the heat shrinkable film 150 to the second electrode 140. In this embodiment, the first adhesive layer 160 directly contacts the second electrode 140 and the heat shrinkable film 150, but is not limited thereto. The thickness of the first adhesive layer 160 may be from 10 μm to 50 μm. The area of the first adhesive layer 160 may not be less than (ie, larger than or equal to) the area of the light emitting layer 130, so that the heat shrinkable film 150 substantially covers the entire area of the light emitting layer 130, but is not limited thereto. The first adhesive layer 160 may be a material having adhesive properties such as acrylic adhesive, UV (ultraviolet) adhesive, pressure sensitive adhesive, and hot pressing adhesive. In some embodiments, the first adhesive layer 160 may include a substrate and an adhesive material formed on the surface of the substrate. When serving as the first adhesive layer 160, both surfaces of the substrate may be coated or formed by an adhesive material. The substrate used to constitute the first adhesive layer 160 may be a PET substrate or a non-woven substrate, and has a thickness of 0.01 mm (millimeter) to 0.12 mm. If it is considered that the light emitting layer 130 may be degraded under the influence of water vapor, the first adhesive layer 160 may be added with a moisture-absorbing material such as calcium oxide, magnesium oxide, or the like.

The adhesion strength between the light emitting layer 130 and the second electrode 140 may be smaller than the adhesion strength between the first adhesive layer 160 and the second electrode 140. Therefore, when the heat shrinkable film 150 shrinks, the second electrode 140 can be easily pulled so that the second electrode 140 deforms as the heat shrinkable film 150 shrinks. The light emitting device 100 can be self-repaired through such a mechanism. For example, FIGS. 2A-2D schematically illustrate the repair process provided by the heat shrinkable film in the light emitting device. Here, although the light emitting device 100 of FIG. 1 is used to illustrate the repair process, the disclosure is not limited thereto. The heat shrinkable film in the light emitting device of other embodiments also has the repair process as illustrated in FIGS. 2A-2D.

Figure 2A:
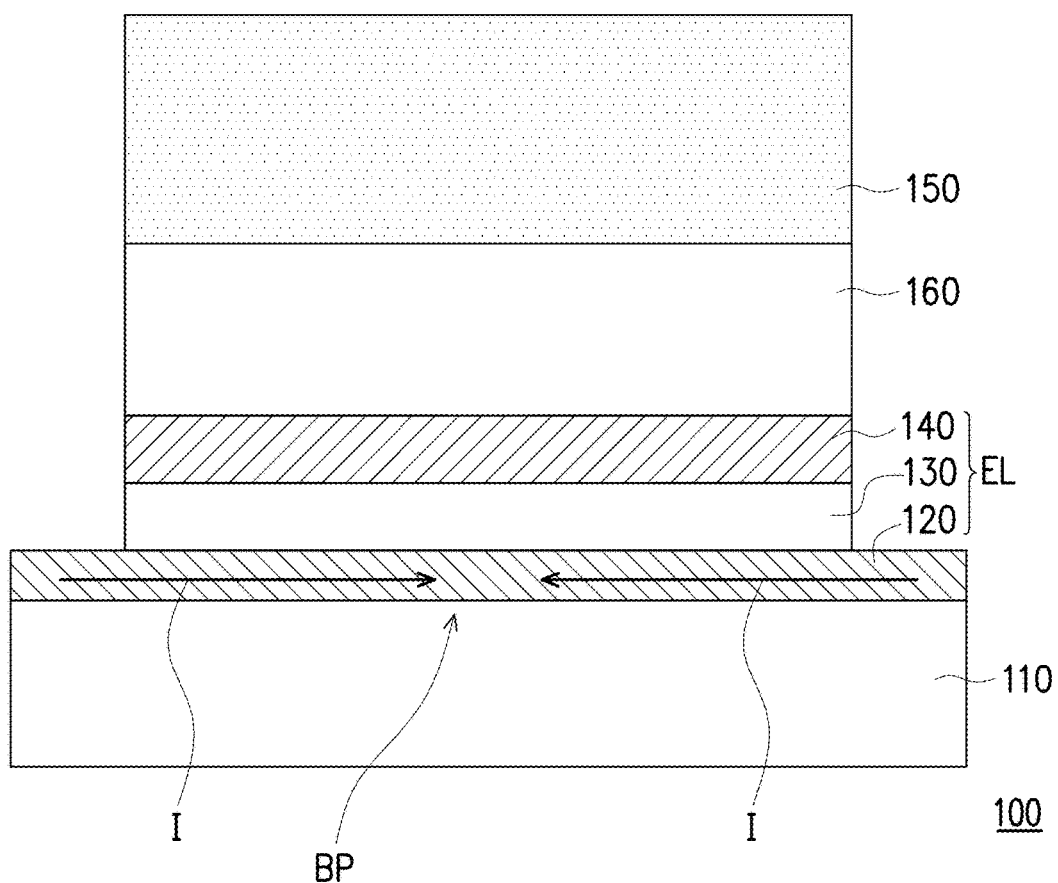
FIGS. 2A-2E schematically illustrate the repair process provided by the heat shrinkable film in the light emitting device.

Referring to FIG. 2A, in accordance with some embodiments, certain particles such as a contamination, a particle of the electrode material, or the like may exist in at least one of the substrate 110, the first electrode 120 and the second electrode 140. In the case that the particle has an extraordinary size, e.g. obviously larger than the adjacent ones, an uneven distribution of current may occur when the light emitting device 100 is turned on. Alternatively, in the case that a pin hole or a recess exist in the light emitting layer 130, the second electrode 140 may be caved at the position corresponding to the pin hole or the recess, which causes an uneven distribution of current when the light emitting device 100 is turned on. FIG. 2A shows that the light emitting device 100 has an abnormal point BP when the light emitting device 100 is turned on. At this time, the current I will be concentrated at the abnormal point BP, so that the current density at the abnormal point BP is higher than elsewhere. A larger amount of the current I will cause the light emitting layer 130 at the abnormal point BP to emit light in a higher intensity manner. In other words, the brightness of the light emitting device 100 at the abnormal point BP or the region around the abnormal point BP may be greater than that at the remaining regions, which generates the so-called bright point or white point. In addition, more heat is generated at and/or around the abnormal point BP. When the light emitting layer 130 is subjected to a high temperature, it may be deteriorated, and even carbonized or vaporized. Accordingly, the occurrence of the abnormal point BP may cause the light emitting effect of the light emitting device 100 uneven and even worse, the light emitting device 100 may fail to work if the current concentration is not mitigated.

Figure 2B:
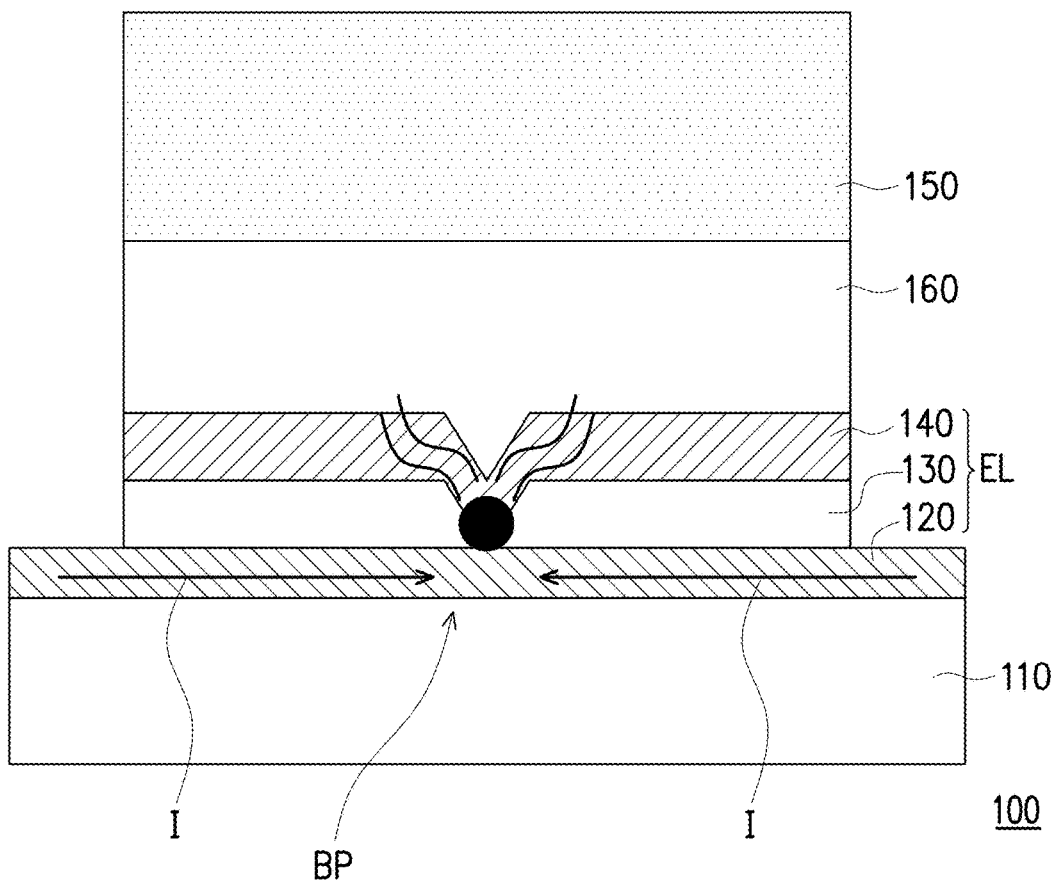

In one instance, as shown in FIG. 2B, the light emitting layer 130 may collapse or be locally burned at the abnormal point BP, which will cause the distance between the second electrode 140 and the first electrode 120 to be reduced, or even the second electrode 140 is in contact with the first electrode 120, which will enhance the concentration of the current I. Since the current I is mostly concentrated at the abnormal point BP, the light emitting device 100 cannot emit light normally and thus presents in a failure state. If there is no corresponding repair process, the light emitting layer 130 will coke and collapse, or the burned area will be gradually expanded, causing the entire damaged area of the light emitting device 100 to become larger and larger.

Figure 2C:
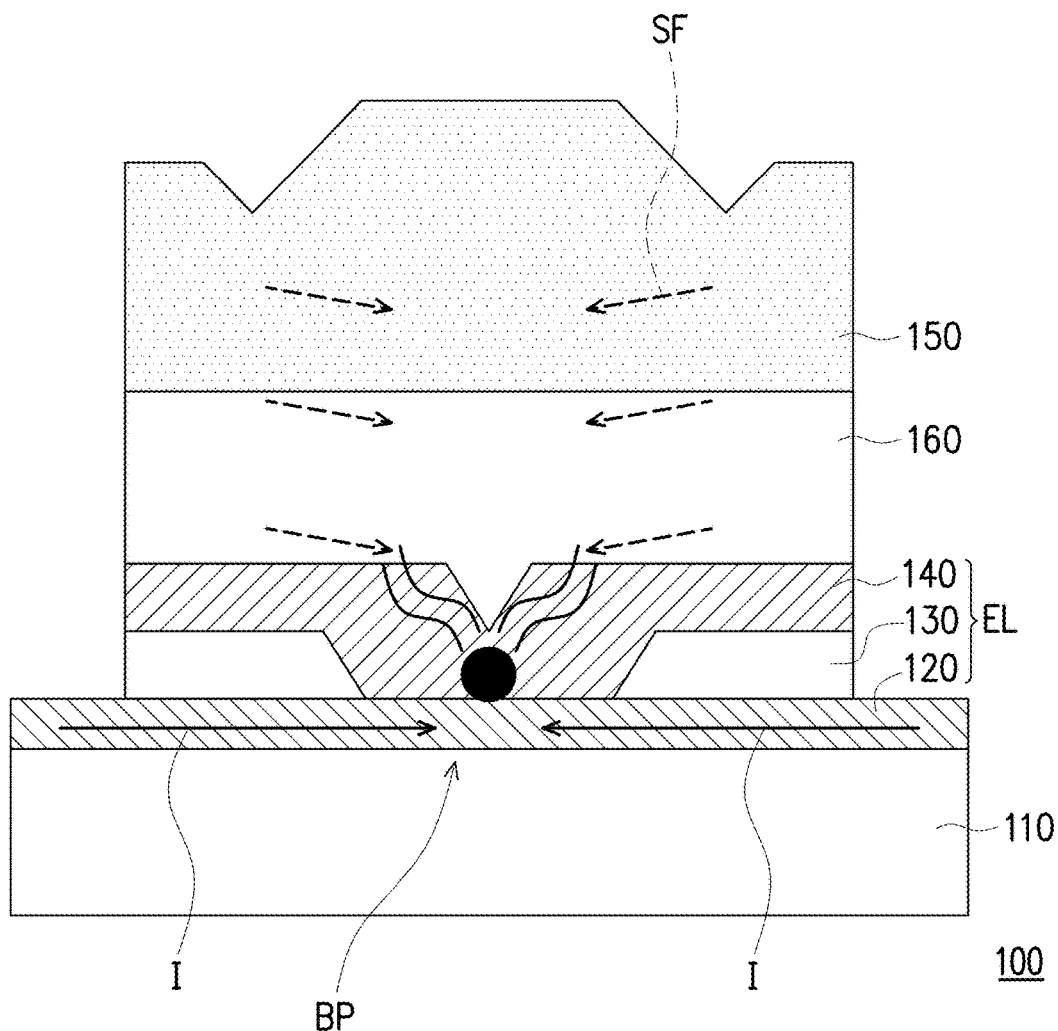

According to FIG. 2C which schematically shows that the second electrode 140 is rendered in contact with the first electrode 120 when the light emitting layer 130 is caved or partially burned at the abnormal point BP, the light emitting device 100 includes a heat shrinkable film 150 attached to the light emitting unit EL. The increase in temperature at the abnormal point BP can cause the heat shrinkable film 150 to contract. At this time, since the adhesion strength between the first adhesive layer 160 and the second electrode 140 is greater than the adhesion strength between the second electrode 140 and the light emitting layer 130, the shrinkage stress SF of the heat shrinkable film 150 may pull the second electrode 140 to partially deform a portion of the second electrode 140 corresponding to the abnormal point BP.

Figure 2D:
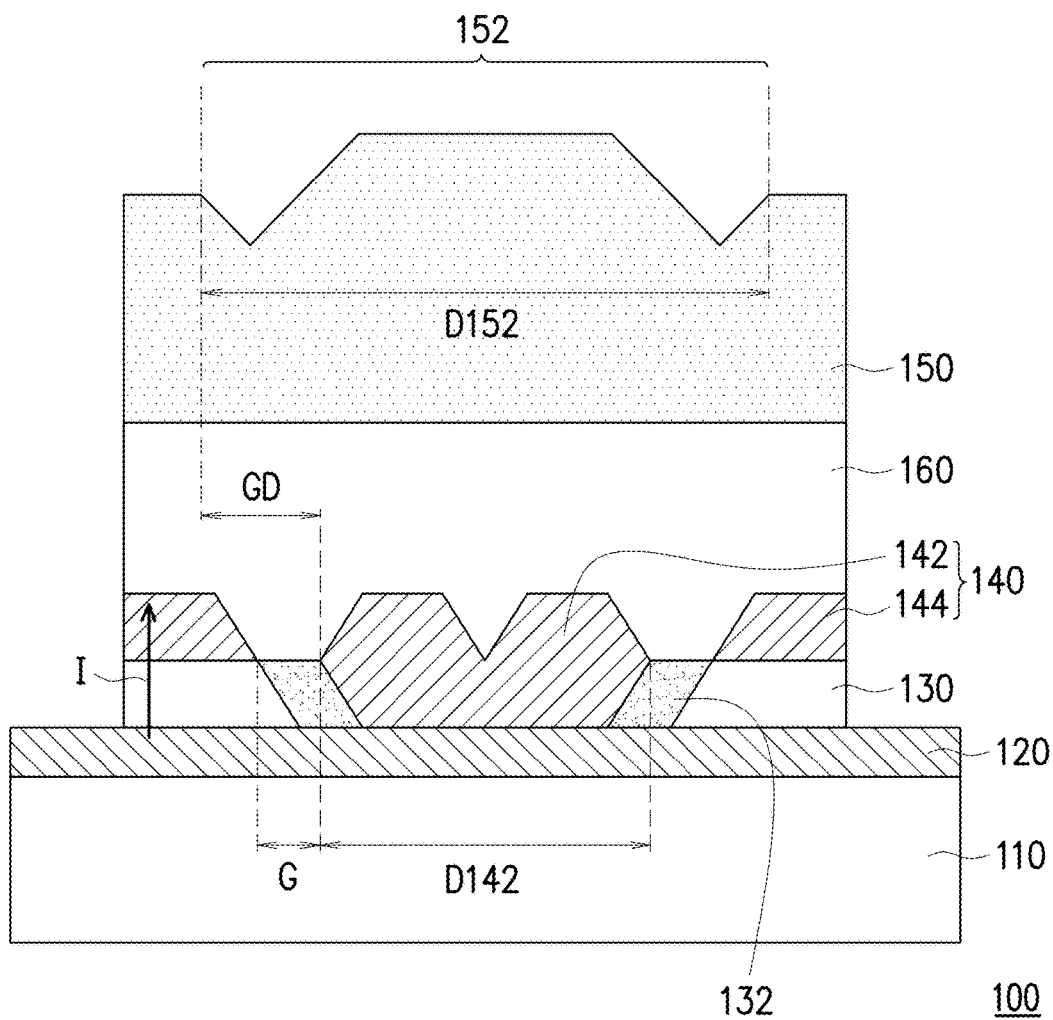

In FIG. 2D, the local portion of the second electrode 140 corresponding to the abnormal point BP continues to contract and deform under the shrinkage stress SF of the heat shrinkable film 150, and is finally disconnected. At this time, the second electrode 140 may include an independent electrode pattern 142 and an effective electrode portion 144, and the effective electrode portion 144 is separated from the independent electrode pattern 142 by the electrode gap G. The electrode gap G may have a continuous ring pattern or a closed ring pattern, so that the effective electrode portion 144 and the independent electrode pattern 142 are two portions that are structurally independent from each other and electrically isolated from each other. The independent electrode pattern 142 may be in contact with the first electrode 120, or there may also be a coked light emitting layer material therebetween. After the independent electrode pattern 142 forms a completely independent conductive pattern and continues to apply power to the light emitting device 100, the current I will not flow through the independent electrode pattern 142 but is uniformly transmitted between the effective electrode portion 144 of the second electrode 140 and the first electrode 120. Therefore, the effective electrode portion 144 of the second electrode 140 can emit light efficiently within the area of the effective electrode portion 144. In other words, after the independent electrode pattern 142 is formed, the light emitting device 100 is self-repaired and continues to emit light. However, the area occupied by the independent electrode pattern 142 is a luminescent failure region, which does not emit light. In addition, since the light emitting layer 130 between the independent electrode pattern 142 and the first electrode 120 is coking by being subjected to a high temperature, the coked light emitting layer material 132 may be distributed around the periphery of the independent electrode pattern 142.

In some embodiments, the practical voltage of the light emitting device 100 may be reduced from an operation voltage (e.g. greater than or equal to 6 volt) to a reduced voltage (e.g. less than 5 volt) and the region at and/or around the abnormal point BP may present a greater brightness than the remaining regions, which generates a bright point or a white point. In the case that first electrode 120 is in direct contact with the second electrode 140 at the abnormal point BP, the practical voltage of the light emitting device 100 may involve an obviously measurable decrease and the whole light emitting device 100 may fail to emit light. Subsequently, upon the self-repairing of the light emitting device 100, the practical voltage of the light emitting device 100 may be restored to or proximate the operation voltage and the light emitting device 100 may emit light normally at the region outside the abnormal point BP. In some other alternative embodiments, the practical voltage of the light emitting device 100 may be maintained without a measurable change during the period from an initial normal operation status, through the occurrence of the abnormal point BP, to the restored normal operation after repairing. Under the shrinkage stress SF, in addition to the deformation of the second electrode 140 to form the independent electrode pattern 142, the portion of the heat shrinkable film 150 that has undergone thermal contraction also forms a shrinking pattern 152 in structure. In some embodiments, the perimeter of the shrinking pattern 152 surrounds the independent electrode pattern 142, and the radial length D152 of the shrinking pattern 152 is greater than the radial length D142 of the independent electrode pattern 142. The minimum separation distance GD between the outer contour of the shrinking pattern 152 and the outer contour of the independent electrode pattern 142 may be greater than 50 micrometers. The shrinking pattern 152 has been heat-shrunk, so that no pre stress exists inside the shrinking pattern 152. However, other portions of the heat shrinkable film 150 other than the shrinking pattern 152 still have prestress, so other parts of the heat shrinkable film 150 can still be self-repairable. In some embodiments, the entire light emitting device 100 may have a plurality of abnormal points BP. After the repair of the heat shrinkable film 150, a plurality of independent electrode patterns 142 may be generated at the second electrode 140 corresponding to these abnormal points BP. A plurality of shrinking patterns 152 are generated in the heat shrinkable film 150, wherein the quantity of the independent electrode patterns 142 may be equal to the quantity of the shrinking patterns 152, and each of the shrinking patterns 152 surrounds one of the independent electrode patterns 142. In other words, if there are N abnormal points BP in the light emitting device 100, N independent electrode patterns 142 and N shrinking patterns 152 will be generated, and N is a positive integer. When the occurrences of the abnormal points BP are very close, the heat shrinkage ranges corresponding to the neighboring abnormal points BP may be brought together to generate the M independent electrode patterns 142, M shrinking patterns 152 will generate corresponding to the M independent electrode patterns 142, and M can be less than N. In other words, the quantity of the abnormal points BP is not necessarily the same as the quantity of the independent electrode patterns 142, but the quantity of the independent electrode patterns 142 may be consistent with the quantity of the shrinking patterns 152.

Figure 2E:
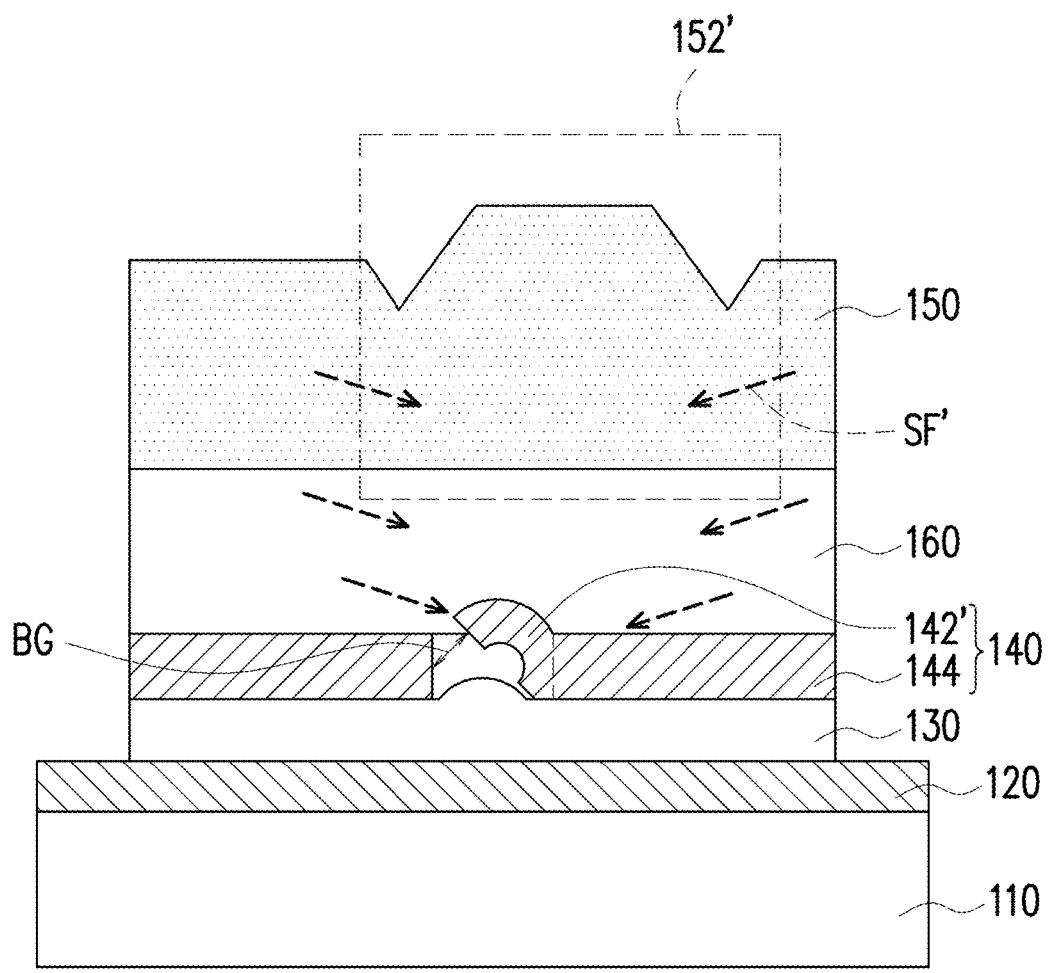
Figure 2F:
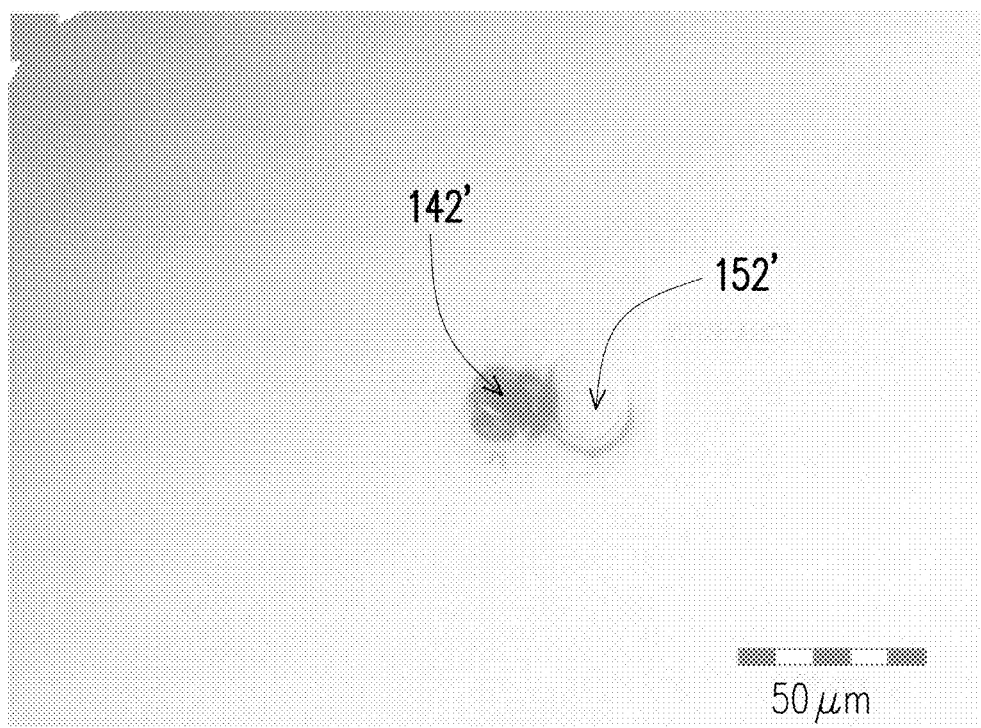
FIG. 2F schematically illustrates a repaired light emitting device in accordance with an embodiment of the present disclosure.

FIG. 2E schematically illustrates the self-repairing of the light emitting device. In FIG. 2E, the first electrode 120 and the second electrode 140 may not be in contact with each other. However, due to the temperature increase caused by the current concentration, the heat shrinkable film 150 attached onto the light emitting unit EL may shrink. The shrinking pattern 152' of the heat shrinkable film 150 may have an area laterally shifted with respect to the area of the abnormal point BP. The shrinkage stress SF' of the heat shrinkable film 150 is applied to the second electrode 140 in an anisotropic manner. For example, the shrinkage of the heat shrinkable film 150 causes the stress which allows a portion of the second electrode 140 at the abnormal point BP to be pull in a direction toward the shrinking pattern 152'. At this time, since the adhesion strength between the first adhesive layer 160 and the second electrode 140 is greater than the adhesion strength between the second electrode 140 and the light emitting layer 130, the second electrode 140 may be broken and warped by the pulling stress of the heat shrinkable film 150, so that the warped pattern 142' is formed. Now, the second electrode 140 may include the warped pattern 142' not in contact with the light emitting layer 130 and the effective electrode portion 144 in contact with the light emitting layer 130. A portion of the warped pattern 142' is separated from the effective electrode portion 144 via the break gap BG while the remaining portions of the warped pattern 142' remain in contact with the effective electrode portion 144. The break gap BP is substantially positioned at a side of the warped pattern 142' away from the shrinking pattern 152'. An area of the shrinking pattern 152' of the heat shrinkable film 150 and an area of the warped pattern 142' of the second electrode 140 may be laterally shifted relative to each other. FIG. 2F schematically shows the self-repaired light emitting device in accordance to an experimental example, wherein the area of the of the shrinking pattern 152' of the heat shrinkable film 150 and an area of the warped pattern 142' of the second electrode 140 are laterally shifted relative to each other. Once the second electrode 140 is broken at the abnormal point BP, the current no longer passes through the abnormal point BP and evenly spread over the remaining regions of the light emitting device 100, which renders the remaining regions of the light emitting device 100 to emit light as normal. The portion of the light emitting device 100 corresponding to the position of the abnormal point BP does not emit light accordingly.

According to some embodiments, after the occurrence of the abnormal point BP as shown in FIG. 2A, the practical voltage of the light emitting device 100 may not involve a measurable reduction, but the region around the abnormal point BP would be brighter than the remaining region due to the current concentration generated around the abnormal point BP so as to form a bright point or a white point. After the first electrode 120 is rendered not in contact with the second electrode 140 by the self-repairing of the light emitting device 100 as shown in FIG. 2E, the practical voltage of the light emitting device 100 may still maintain in a steady state without involving a measurable change, and the region around the abnormal point BP may no longer emit light while the region of the light emitting device 100 outside the abnormal point BP may emit light as normal. Accordingly, during the period from the occurrence of the abnormal point BP to the completion of the repairing, the practical voltage of the light emitting device 100 may maintain in a substantial constant state or slightly varied without involving a measurable change.

Figure 3:
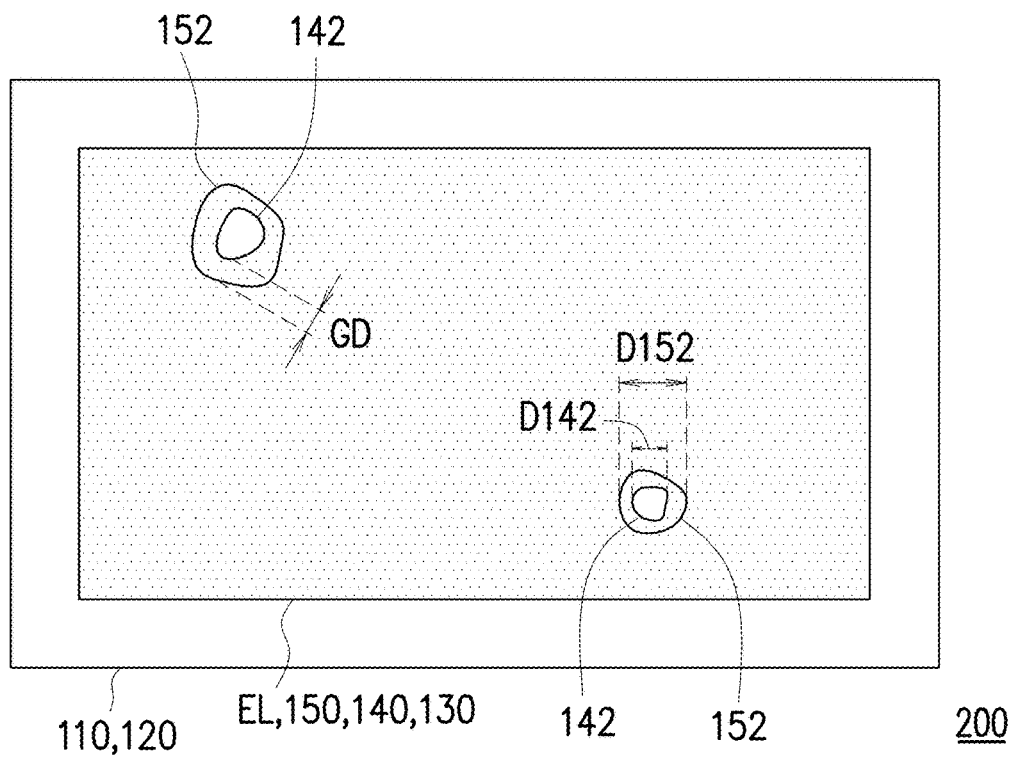
FIG. 3 is a schematic top view of a light emitting device according to an embodiment of the present disclosure.

FIG. 3 is a schematic top view of a light emitting device according to an embodiment of the present disclosure. In FIG. 3, the light emitting device 200 includes a substrate 110, a light emitting unit EL, and a heat shrinkable film 150 attached to the light emitting unit EL. FIG. 3 only schematically shows the disposition relationship of the substrate 110, the light emitting unit EL, and the heat shrinkable film 150 in the top view, wherein the outlines of the light emitting unit EL and the heat shrinkable film 150 can be aligned with each other, but not limited thereto. The stacking relationship of the substrate 110, the light emitting unit EL, and the heat shrinkable film 150 in the cross-sectional structure are the specific components of the light emitting unit EL may be the same as the cross-sectional structure shown in FIG. 2D, but not limited thereto. For example, the light emitting unit EL of the light emitting device 200 may include the first electrode 120, the light emitting layer 130, and the second electrode 140 sequentially stacked on the substrate 110 as shown in FIG. 2D, and the heat shrinkable film 150 may be attached to the light emitting unit EL through the first adhesive layer 160. In FIG. 3, the second electrode 140 of the light emitting unit EL has two independent electrode patterns 142, and the heat shrinkable film 150 has two shrinking patterns 152. The perimeter of each of the shrinking patterns 152 surrounds one of the independent electrode patterns 142, and the radial length D152 of the shrinking pattern 152 may be greater than the radial length D142 of the independent electrode pattern 142. When the light emitting device 200 emits light, the area occupied by the two independent electrode patterns 142 does not emit light, and the remaining area emits light. In addition, in the light emitting device 200 of FIG. 3, the second electrode 140 of the light emitting unit EL may cover the entire area of the light emitting layer 130 to conform to the outline of the light emitting layer 130, and the heat shrinkable film 150 also substantially covers entire area of the second electrode 140.

As a result, an abnormal point in any region of the second electrode 140 may be repaired through the heat shrinkage of the heat shrinkable film 150.

Figure 4:
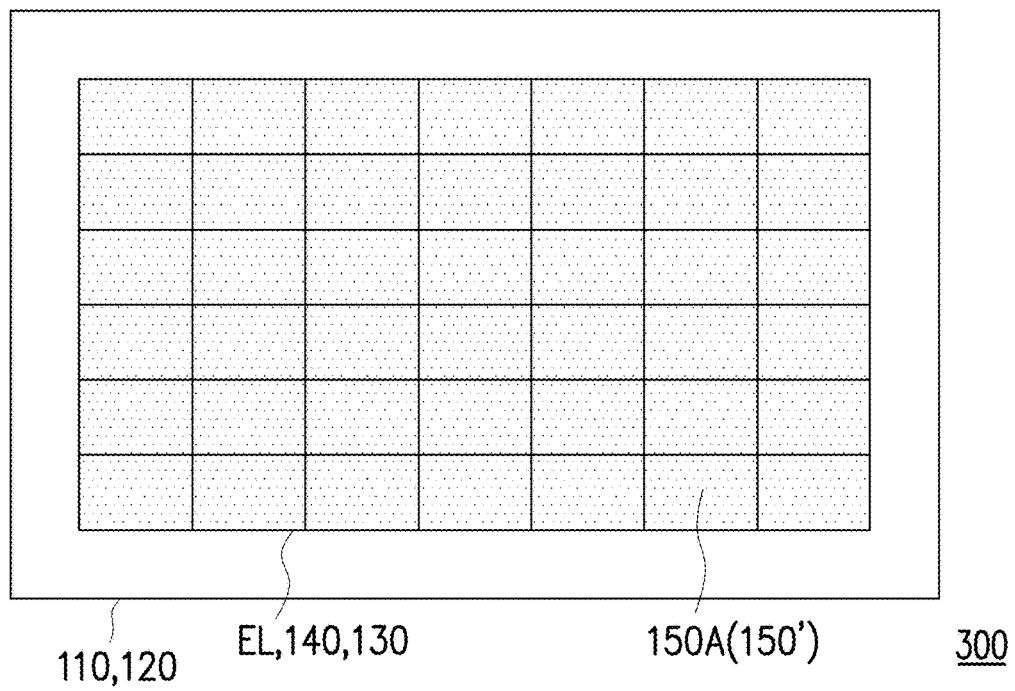
FIG. 4 is a schematic top view of a light emitting device according to another embodiment of the present disclosure.

However, in other embodiments, the heat shrinkable film 150 may be patterned. For example, FIG. 4 is a schematic top view of a light emitting device according to another embodiment of the present disclosure. The light emitting device 300 of FIG. 4 includes a substrate 110, a light emitting unit EL, and a heat shrinkable film 150' attached to the light emitting unit EL. FIG. 4 only schematically shows the disposition relationship of the substrate 110, the light emitting unit EL, and the heat shrinkable film 150' in the top view. The configuration relationship of each of the light emitting device 300 constructed in the cross-sectional structure may be generally similar to the cross-sectional structure as shown in FIG. 1, but not limited thereto. For example, the light emitting unit EL of the light emitting device 300 may comprise the first electrode 120, the light emitting layer 130, and the second electrode 140 sequentially stacked on the substrate 110, as shown in FIG. 1, and the heat shrinkable film 150' may be attached to the light emitting unit EL through the first adhesive layer 160. In the present embodiment, the heat shrinkable film 150' is patterned to include a plurality of heat shrinkable film patterns 150A, and an orthographic projection of the heat shrinkable film patterns 150A is located within the area of the second electrode 140 and substantially covers the entire area of the second electrode 140. As a result, an abnormal point in any area of the second electrode 140 can be repaired by the heat shrinkable film pattern 150A in the corresponding area.

Figure 5:
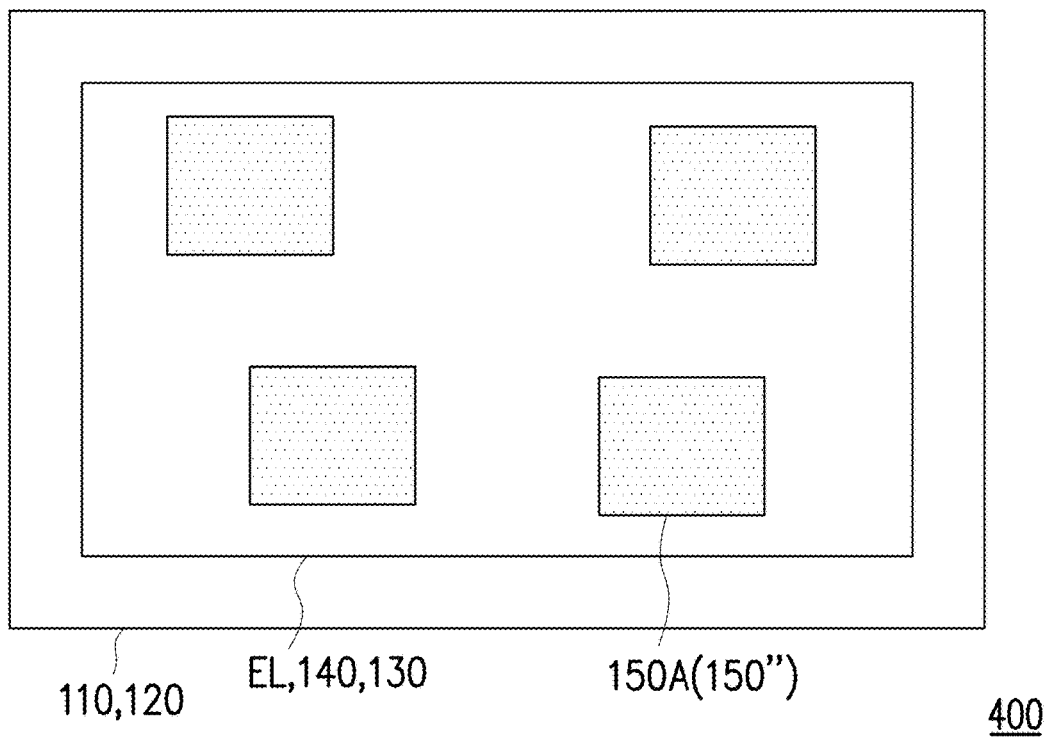
FIG. 5 is a schematic top view of a light emitting device according to still another embodiment of the present disclosure.

FIG. 5 is a schematic top view of a light emitting device according to still another embodiment of the present disclosure. The light emitting device 400 of FIG. 5 includes a substrate 110, a light emitting unit EL, and a heat shrinkable film 150" attached to the light emitting unit EL. FIG. 5 only schematically shows the disposition of the substrate 110, the light emitting unit EL, and the heat shrinkable film 150" in the top view. The configuration relationship of each component in the light emitting device 400 in the cross-sectional structure may be generally similar to the cross-sectional structure shown in FIG. 1, but it is not limited thereto. For example, the light emitting unit EL of the light emitting device 400 may include the first electrode 120, the light emitting layer 130, and the second electrode 140 sequentially stacked on the substrate 110 as shown in FIG. 1, and the heat shrinkable film 150" may be attached to the light emitting unit EL through the first adhesive layer 160. In the present embodiment, the heat shrinkable film 150" is patterned to include a plurality of heat shrinkable film patterns 150A, and the heat shrinkable film pattern 150A covers only a partial area of the light emitting unit EL. In some embodiments, the heat shrinkable film pattern 150A may be attached to an area where an abnormal point is more likely to occur in the light emitting device 400.

In some embodiments, the heat shrinkable film pattern 150A can be attached to the light emitting device after the light emitting device fails. For example, if a light emitting device to which a heat shrinkable film is not attached is lighted and fails due to an abnormal point, which does not emit light, the heat shrinkable film pattern 150A can be attached to the abnormal point, such as the observed coking point of the light emitting layer, on the failed light emitting device, the heat shrinkable film patterns 150A may be attached to the light emitting device through the light emitting area of the light emitting device, or the heat shrinkable film 150 may be attached to cover the entire light emitting area of the light emitting device. Next, the light emitting device attached with the heat shrinkable film 150 or the heat shrinkable film pattern 150A is turned on again, and the attached heat shrinkable film 150 or the attached heat shrinkable film pattern 150A can allow the repair process to be carried out during the lighting of the light emitting device 400, as shown in FIG. 2A. to FIG. 2D. As such, the heat shrinkable film 150 or the heat shrinkable film patterns 150A at the abnormal point may shrink and cause the corresponding areas of the second electrode 140 to generate independent electrode patterns 142, thereby allowing the light emitting device 400 to be repaired and recover its light emitting ability. Therefore, in addition to being attached to the light emitting device in advance, the heat shrinkable film described in the above embodiments may be attached to the light emitting device after the light emitting device fails. Both methods can achieve the repairing of the light emitting device to maintain the ability of emitting light. In some embodiments, if an abnormal point already exists in the light emitting device, the area of the abnormal point (the material of the light emitting layer has been coked) may be detected first, and the heat shrinkable film pattern with an area larger than the area of the abnormal point may be attached to the abnormal point. For example, the area of the heat shrinkable film pattern may be more than 10 times the area of the abnormal point.

Figure 6:
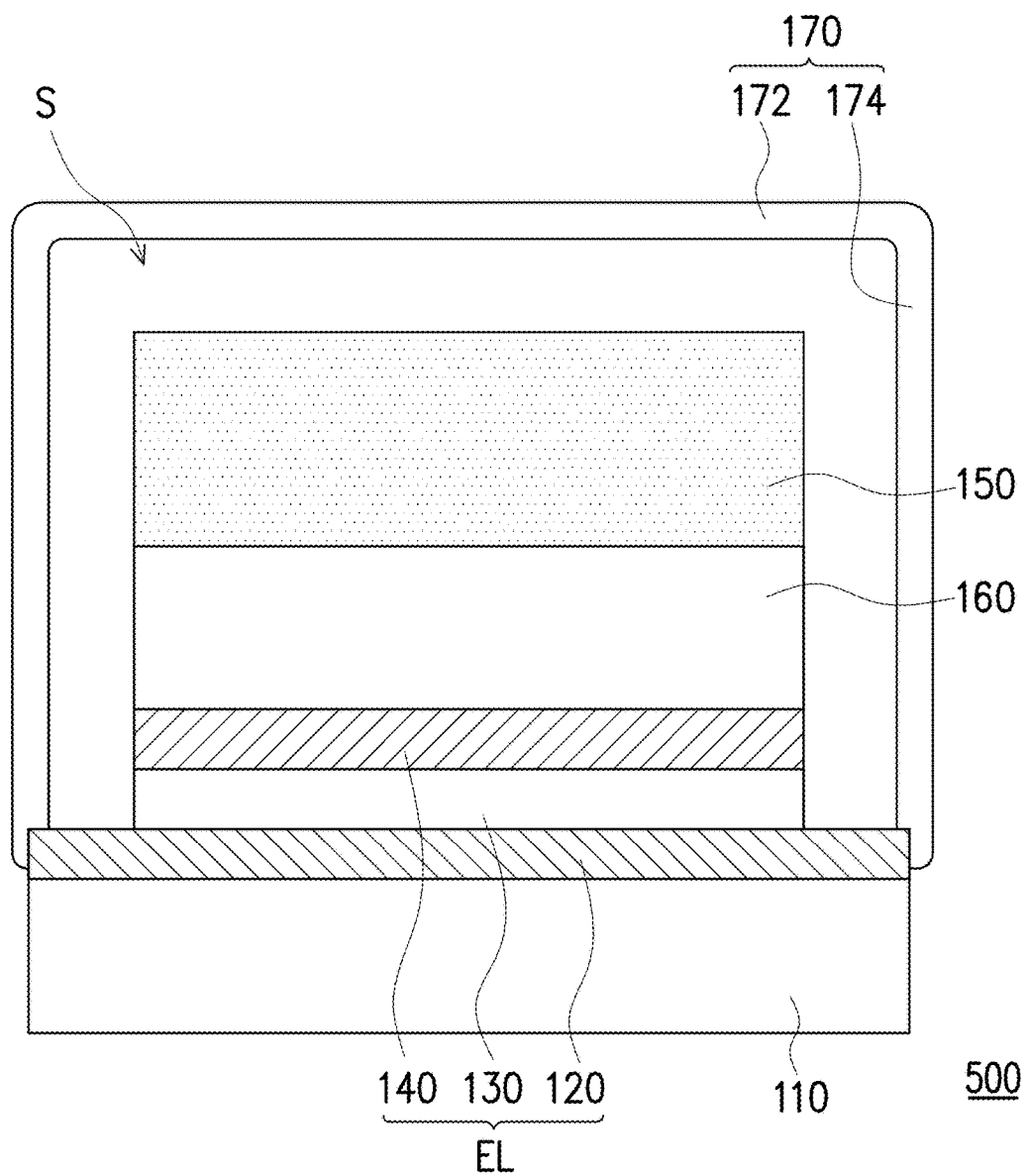
FIGS. 6-8 are schematic sectional views of respective light emitting devices according to some embodiments of the present disclosure.
Figure 7:
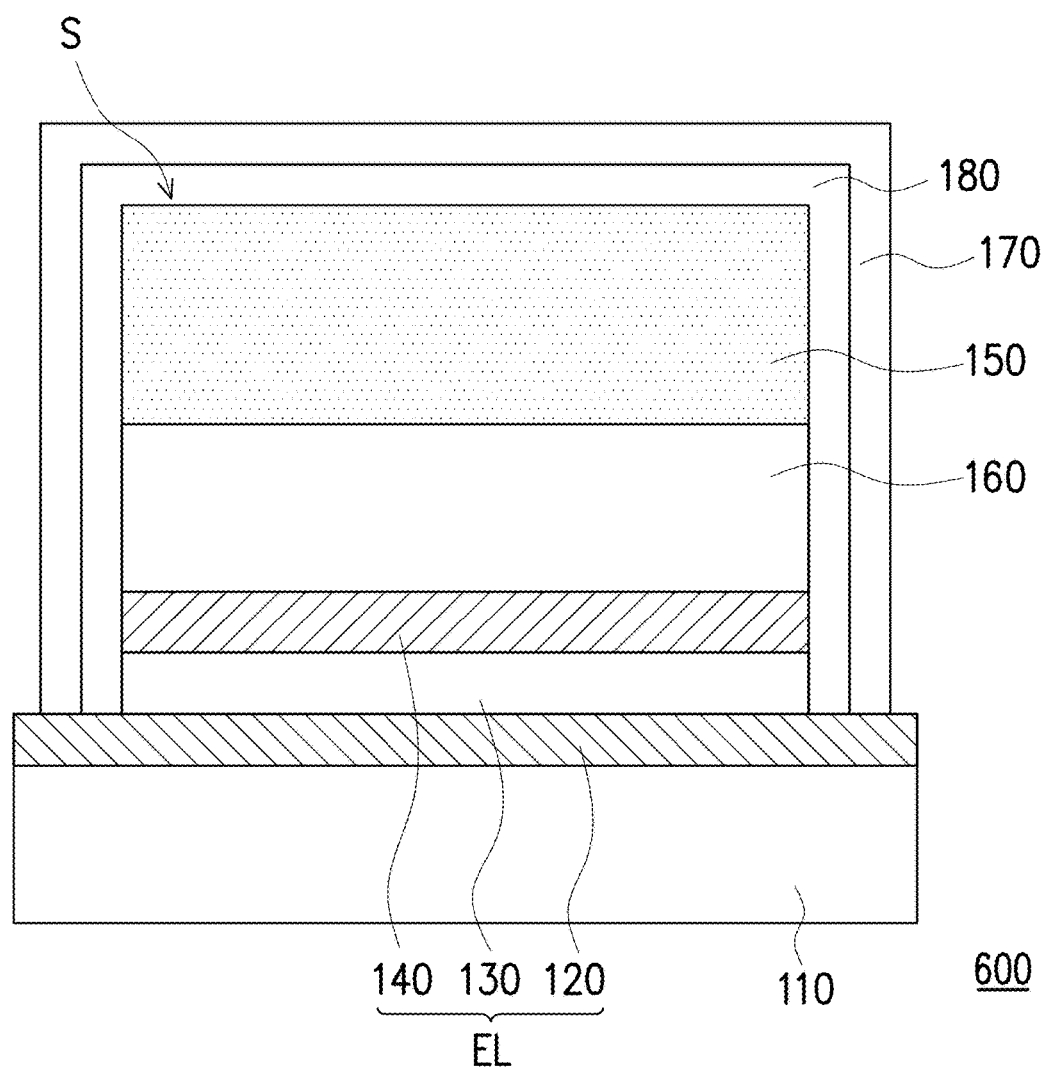
Figure 8:
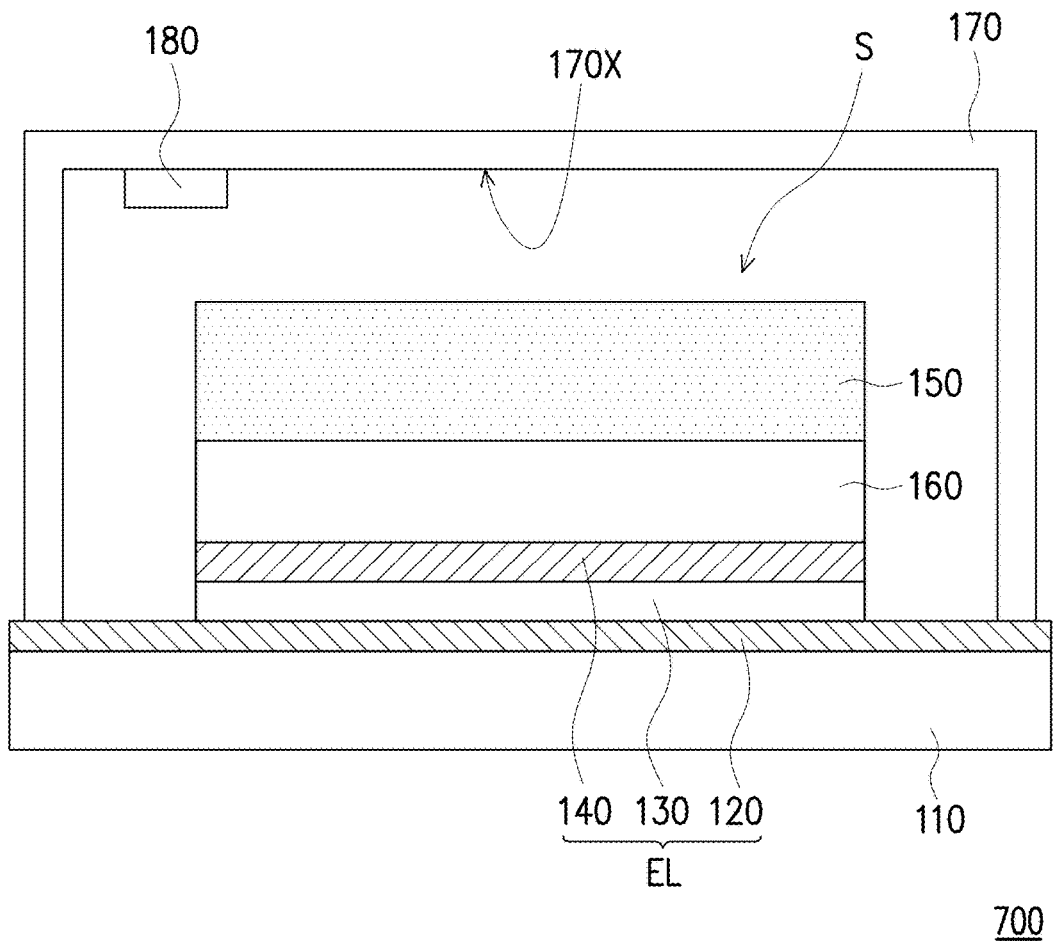

FIGS. 6-8 are cross-sectional views of the respective light emitting devices according to some embodiments of the present disclosure. Referring to FIG. 6-8, the light emitting device 500 to the light emitting device 700 are similar to the light emitting device 100 of FIG. 1. The light emitting device 500 to the light emitting device 700 each includes a substrate 110, a light emitting unit EL, and a heat shrinkable film 150. In addition to the first adhesive layer 160, a package cover 170 is further included. From FIG. 6, the package cover 170 is a lid having a top portion 172 and a peripheral portion 174. The peripheral portion 174 of the package cover 170 is located between the substrate 110 and the top portion 172 of the package cover 170. Thus, the package cover 170 and the substrate 110 surround the sealed space S. The light emitting unit EL, the first adhesive layer 160, and the heat shrinkable film 150 are sealed in the sealed space S between the package cover 170 and the substrate 110.

The volume of the sealed space S may be greater than the sum of the volume of the light emitting layer 130 and the second electrode 140 of the light emitting unit EL, so that the package cover 170 does not directly contact the light emitting layer 130 and the second electrode 140. The sealed space S between the light emitting unit EL and the package cover 170 may be vacuum, as shown in FIG. 6. Or, as shown in the light emitting device 600 of FIG. 7, the water vapor/oxygen barrier material 180 may be filled in the sealed space S between the light emitting unit EL and the package cover 170. Alternatively, as shown in the light emitting device 700 of FIG. 8, the light emitting device 700 further includes a water getter 182 disposed on the inner surface 170X of the package cover 170. The heat shrinkable film 150 in FIGS. 6-8 can allow the repair process as described in FIGS. 2A-2D to be carried out to let the light emitting devices 500 to 700 have the self-repairing ability. After the light emitting device 500 to 700 is self-repaired, the top view at the repair point may have the shrinking pattern 152 and the independent electrode pattern 142 as shown in FIG. 3, or the shrinking pattern 152' and the warped pattern 142' as shown in FIGS. 2E and 2F.

Figure 9:
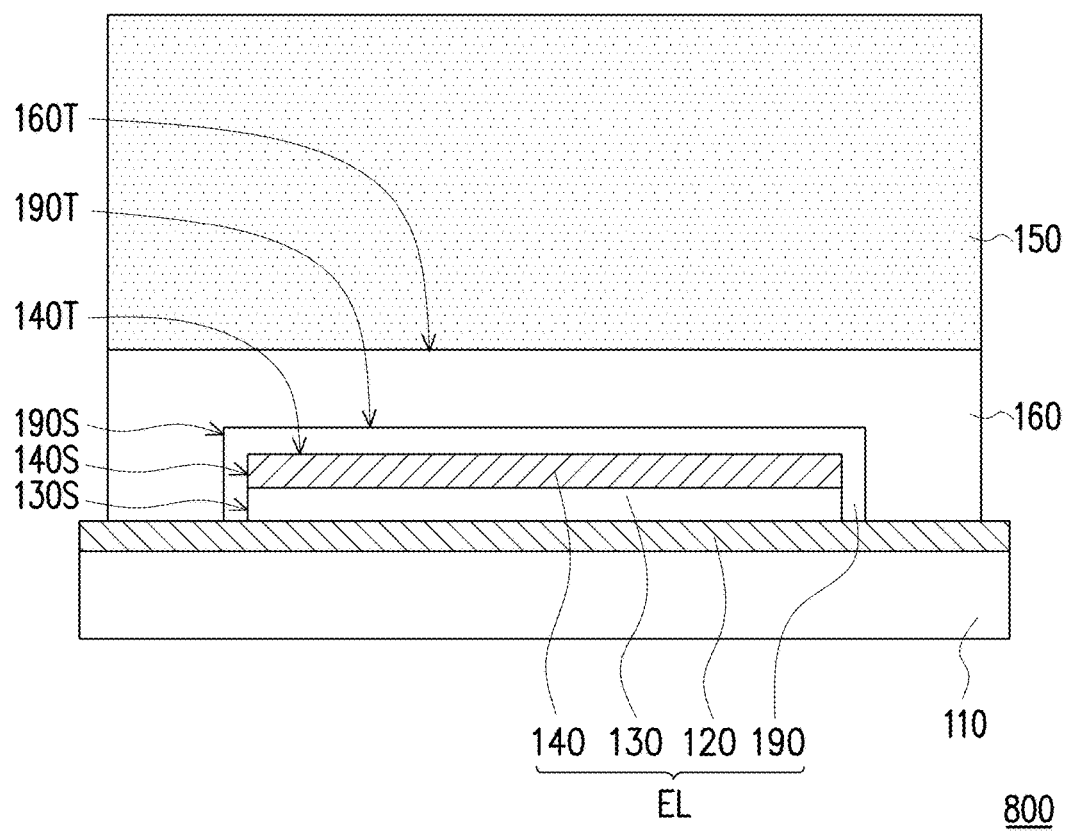
FIG. 9 is a schematic cross-sectional view of a light emitting device according to still another embodiment of the present disclosure.

FIG. 9 is a schematic cross-sectional view of a light emitting device according to still another embodiment of the present disclosure. Referring to FIG. 9, the light emitting device 800 is similar to the light emitting device 100 of FIG. 1. The light emitting device 800 includes a substrate 110, a light emitting unit EL, a heat shrinkable film 150, and a first adhesive layer 160. In addition to the first electrode 120, the light emitting layer 130, and the second electrode 140, the light emitting unit EL further includes an encapsulating cover layer 190. The encapsulating cover layer 190 is disposed on the substrate 110, wherein the light emitting layer 130 and the second electrode 140 of the light emitting unit EL are encapsulated between the encapsulating cover layer 190 and the substrate 110.

The heat shrinkable film 150 is attached to the encapsulating cover layer 190 by the first adhesive layer 160. As shown in FIG. 9, the encapsulating cover layer 190 covers the top surface 140T of the second electrode 140 and the side surface 140S of the second electrode 140, and also covers the side surface 130S of the light emitting layer 130. The encapsulating cover layer 190 can be a water vapor/oxygen barrier to prevent water vapor/oxygen from penetrating into the light emitting unit EL to prevent the light emitting layer 130 from deteriorating due to the invasion of water vapor.

In addition, in this embodiment, the first adhesive layer 160 may cover the encapsulating cover layer 190. That is, the first adhesive layer 160 covers the top surface 190T of the encapsulating cover layer 190 and also contacts the side surface 190S of the encapsulating cover layer 190. The heat shrinkable film 150 is attached to the top surface 160T of the first adhesive layer 160. In the present embodiment, the heat shrinkable film 150 can perform the repair process described in FIGS. 2A-2D, so that the light emitting device 800 has a self-repairing ability. After the light emitting device 800 is self-repaired, the top view at the repaired point may have the shrinking pattern 152 and the independent electrode pattern 142 as shown in FIG. 3, or the shrinking pattern 152' and the warped pattern 142' as shown in FIGS. 2E and 2F.

Figure 10:
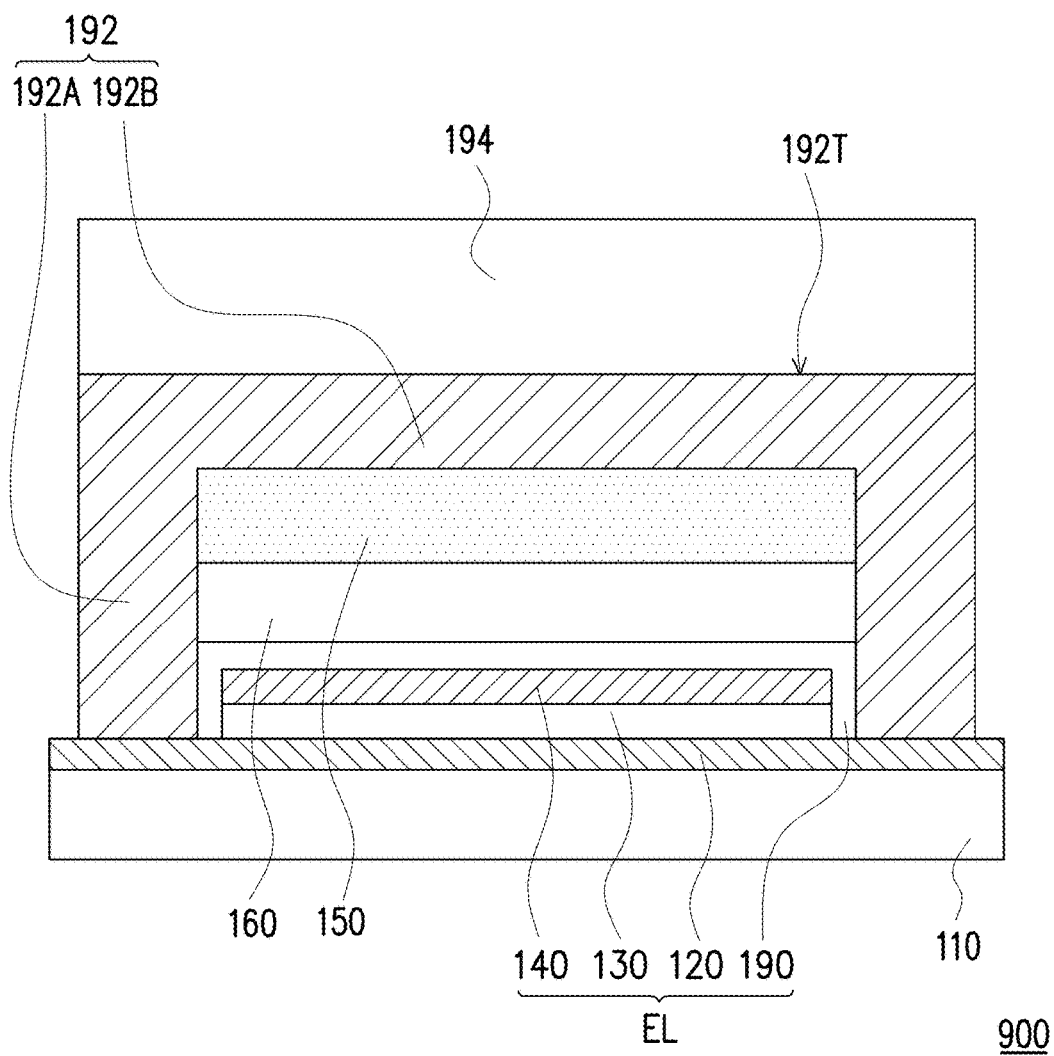
FIG. 10 is a schematic sectional view of a light emitting device according to another embodiment of the present disclosure.

FIG. 10 is a schematic cross-sectional view of a light emitting device according to another embodiment of the present disclosure. Referring to FIG. 10, the light emitting device 900 is similar to the light emitting device 800 of FIG. 9. The light emitting device 900 includes a substrate 110, a light emitting unit EL, a heat shrinkable film 150, and a first adhesive layer 160, and further includes a sealant 192 and a gas barrier substrate 194. The light emitting unit EL, the first adhesive layer 160, and the heat shrinkable film 150 are disposed between the substrate 110 and the gas barrier substrate 194 and surrounded by the sealant 192. In this embodiment, the sealant 192 includes an annular sealant portion 192A and a cover sealant portion 192B. In FIG. 10, an annular sealant portion 192A is located around the light emitting unit EL, the first adhesive layer 160, and the heat shrinkable film 150.

If viewed from a top view (not shown), the annular sealant portion 192A may have a frame-like pattern and surround the light emitting unit EL, the first adhesive layer 160, and the heat shrinkable film 150. The covering sealant portion 192B is surrounded by the annular sealant portion 192A and is integrally formed with the annular sealant portion 192A.

The light emitting unit EL, the first adhesive layer 160, and the heat shrinkable film 150 are located between the covering sealant portion 192B and the substrate 10. The gas barrier substrate 194 is disposed on the top surface 192T of the sealant 192. The sealant 192, the light emitting unit EL, the first adhesive layer 160, and the heat shrinkable film 150 are located between the gas barrier substrate 194 and the substrate 10. In some embodiments, the gas barrier substrate 194 serves as a water vapor/oxygen barrier and is a metal foil substrate, for example.

Figure 11:
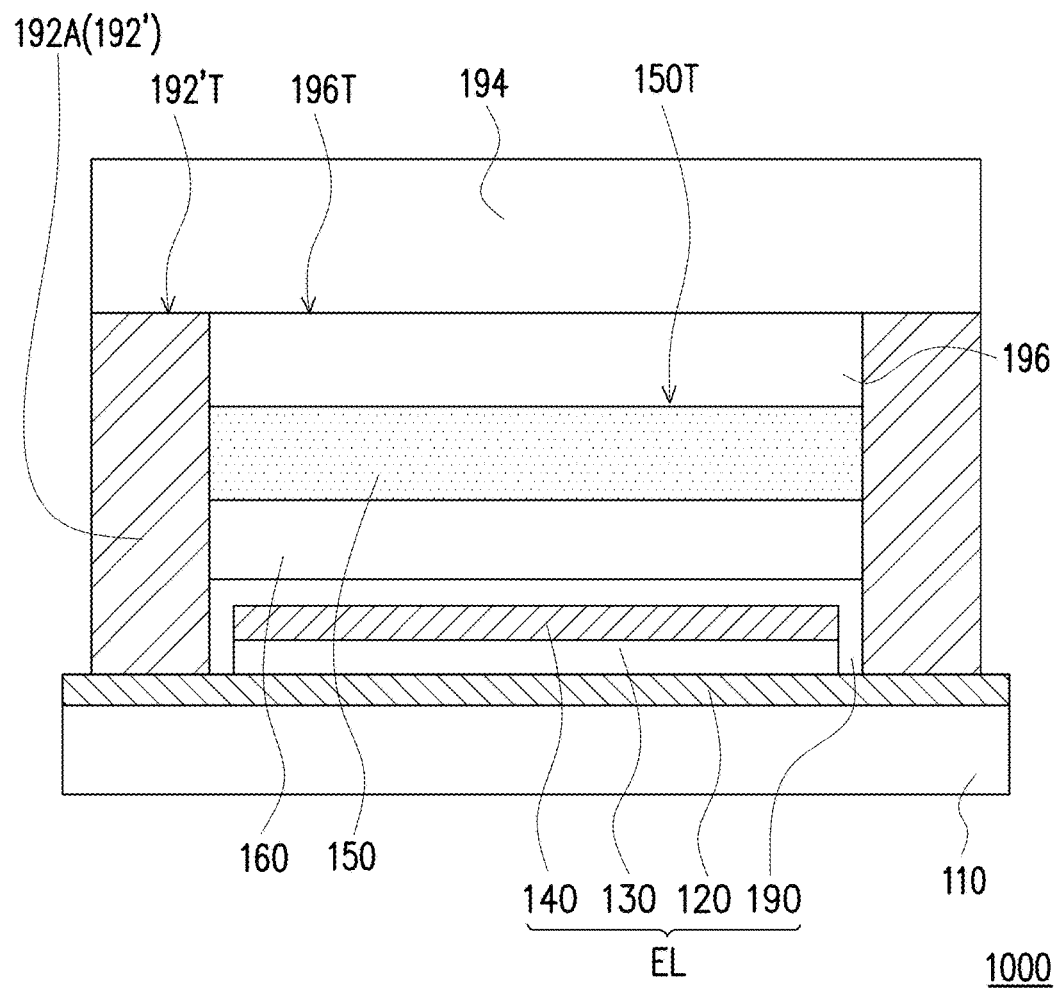
FIG. 11 is a schematic cross-sectional view of a light emitting device according to yet another embodiment of the present disclosure.

FIG. 11 is a schematic cross-sectional view of a light emitting device according to yet another embodiment of the present disclosure. Referring to FIG. 11, the light emitting device 1000 is similar to the light emitting device 900 of FIG. 10, and the light emitting device 1000 includes a substrate 110, a light emitting unit EL, a heat shrinkable film 150, a first adhesive layer 160, a sealant 192', and a gas barrier substrate 194, and further includes a second adhesive layer 196. In the present embodiment, the sealant 192' is substantially comprised of an annular sealant portion 192A. If viewed from a top view (not shown), the sealant 192' may have a frame-like pattern and surround the light emitting unit EL, the first adhesive layer 160, and the heat shrinkable film 150. In addition, the sealant 192' does not cover the top surface 150T of the heat shrinkable film 150, and the second adhesive layer 196 is disposed between the heat shrinkable film 150 and the gas barrier substrate 194. The adhesion strength of the second adhesive layer 196 and the heat shrinkable film 150 may be smaller than the adhesion strength of the first adhesive layer 160 and the heat shrinkable film 150, so that the shrinkage stress of the heat shrinkable film 150 may be transmitted toward the second electrode 140. The thickness of the sealant 192' is not less than the sum of the thicknesses of the light emitting unit EL, the first adhesive layer 160, the heat shrinkable film 150, and the second adhesive layer 196, so the second adhesive layer 196 can also be surrounded by the sealant 192'. The gas barrier substrate 194 contacts the top surface 196T of the second adhesive layer 196 and the top surface 192I of the sealant 192'.

Figure 12A:
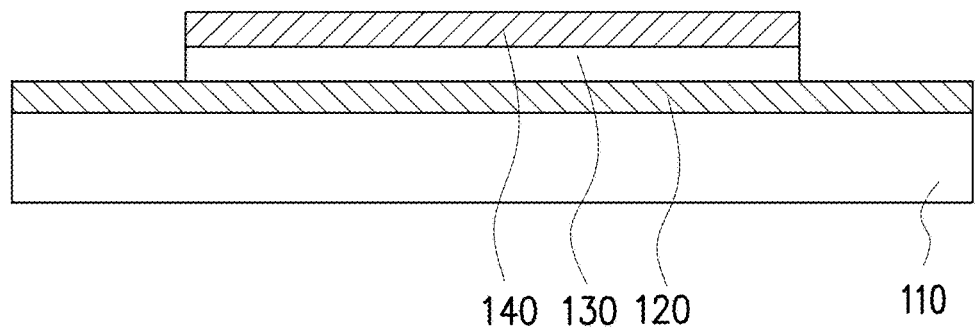
FIGS. 12A-12G schematically illustrate a manufacturing method of the light emitting device 1000.

FIG. 12A-12G schematically illustrate the manufacturing method of the light emitting device 1000. In the step of FIG. 12A, the first electrode 120, the light emitting layer 130, and the second electrode 140 may be sequentially formed on the substrate 110, and the step of FIG. 12A may be used to fabricate the first electrode 120 and the light emitting layer 130 and the second electrode 140 of any of the aforementioned embodiments. In some embodiments, the first electrode 120, the light emitting layer 130, and the second electrode 140 may be sequentially formed on the substrate 110 by vapor deposition. Each of the first electrode 120, the light emitting layer 130, and the second electrode 140 may have a single-layer structure or a multi-layer structure. Here, the so-called multilayer structure may have a plurality of material layers stacked together and adjacent two material layers have different materials. The area of the light emitting layer 130 may be smaller than the area of the first electrode 120, and the area of the second electrode 140 may be substantially equal to or smaller than the area of the light emitting layer 130. The area occupied by the stacking portion formed by overlapping the first electrode 120, the second electrode 140, and the light emitting layer 130 is the light emitting area of the light emitting device 1000.

Figure 12B:
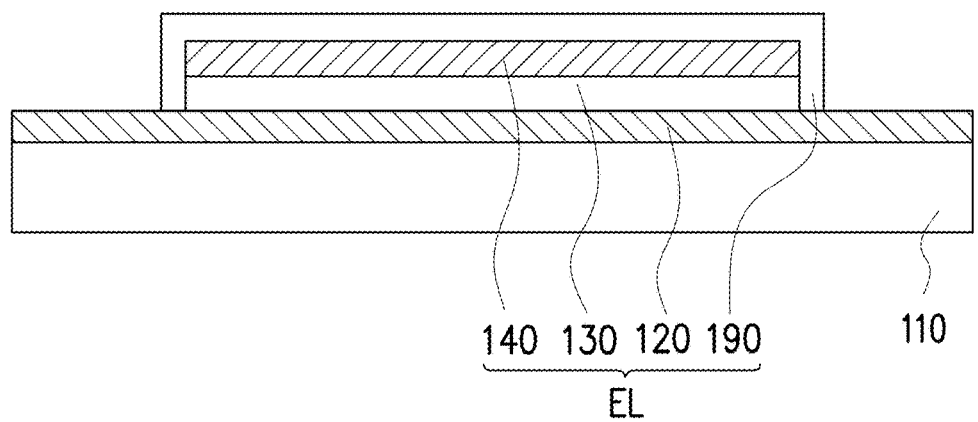

In the step of FIG. 12B, an encapsulating cover layer 190 is further formed on the substrate 110, and the encapsulating cover layer 190 covers the second electrode 140 and the light emitting layer 130 to form the light emitting unit EL of FIGS. 9 to 11. The encapsulating cover layer 190 may have the property of blocking water vapor/oxygen to help to reduce the possibility of the light emitting layer 130 deteriorating due to invading moisture. The encapsulating cover layer 190 can be formed on the substrate 110 using at least one method such as printing, coating, vapor deposition, or sputtering.

Figure 12C:
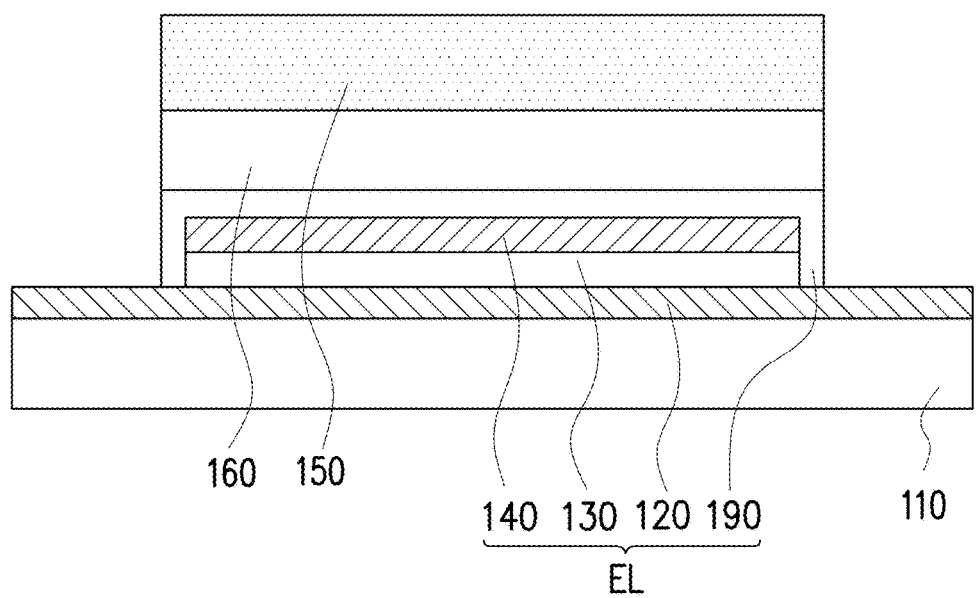

In the step of FIG. 12C, the heat shrinkable film 150 is attached to the encapsulating cover layer 190 using the first adhesive layer 160. One side of the first adhesive layer 160 contacts the heat shrinkable film 150 and the other side thereof contacts the encapsulating cover layer 190. When performing the steps of FIG. 12C, the first adhesive layer 160 may be formed on the heat shrinkable film 150, and the heat shrinkable film 150 attached with the first adhesive layer 160 may be placed with the first adhesive layer 160 facing the encapsulating cover layer 190. A pressure is applied to the encapsulating cover layer 190 to adhere the first adhesive layer 160 to the encapsulating cover layer 190. In addition, when the step of FIG. 12C is performed, the first adhesive layer 160 may also be formed on the encapsulating cover layer 190, and the heat shrinkable film 150 may be attached on the first adhesive layer 160 on the encapsulating cover layer 190. The area occupied by the orthographic projection of the heat shrinkable film 150 and the first adhesive layer 160 may be equal to or greater than the area of the second electrode 140. The peripheral contours of the heat shrinkable film 150, the first adhesive layer 160 and the encapsulating cover layer 190 may be aligned with each other.

Figure 12D:
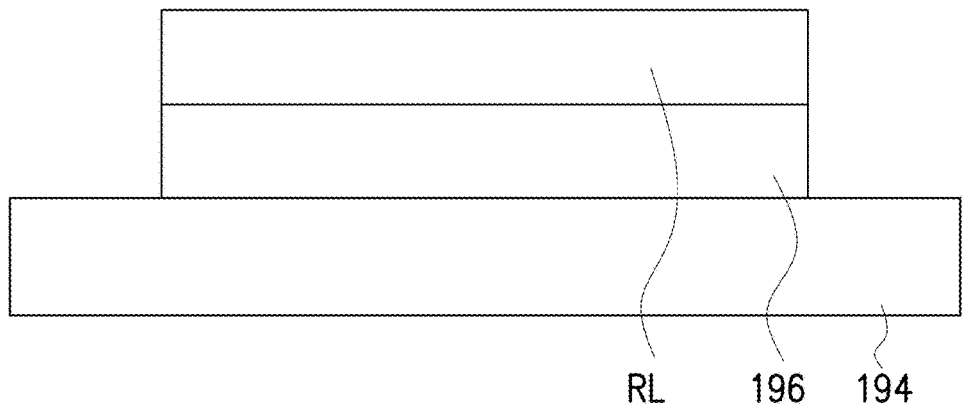

In the step of FIG. 12D, the second adhesive layer 196 and the release layer RL may be sequentially formed on the gas barrier substrate 194. The second adhesive layer 196 may be formed directly on the gas barrier substrate 194, and the profile and size of the second adhesive layer 196 may be preset to be the same as the stacking structure of the heat shrinkable film 150, the first adhesive layer 160, and the encapsulating cover layer 190 of FIG. 12C. The release layer RL is a temporary adhesive material that can be temporarily adhered to the second adhesive layer 196 and can be removed from the second adhesive layer 196 in a subsequent step. The profile and size of the release layer RL may be substantially the same as the second adhesive layer 196.

Figure 12E:
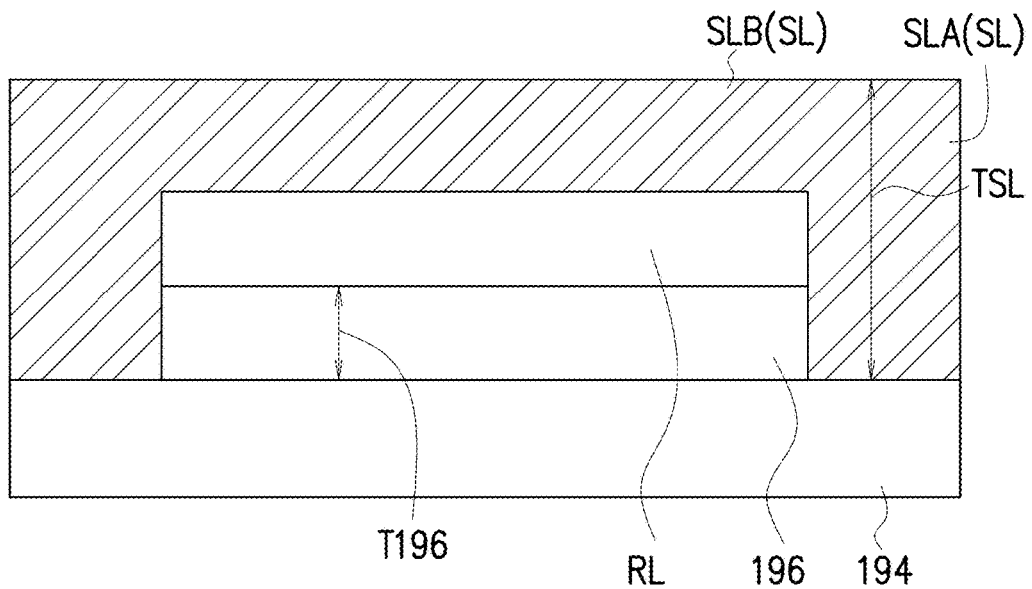

In the step of FIG. 12E, a sealant material layer SL may be formed on the structure shown in FIG. 12D, and the sealant material layer SL may cover the release layer RL and the second adhesive layer 196. In the present embodiment, the sealant material layer SL may include a sealant predetermining portion SLA surrounding the periphery of the release layer RL and the second adhesive layer 196 and a sacrificial portion SLB covering the release layer RL. The difference between the thickness TSL of the sealant predetermining portion SLA and the thickness T196 of the second adhesive layer 196 may be substantially equal to the overall thickness of the heat shrinkable film 150, the first adhesive layer 160, and the light emitting unit EL in FIG. 12C.

Figure 12F:
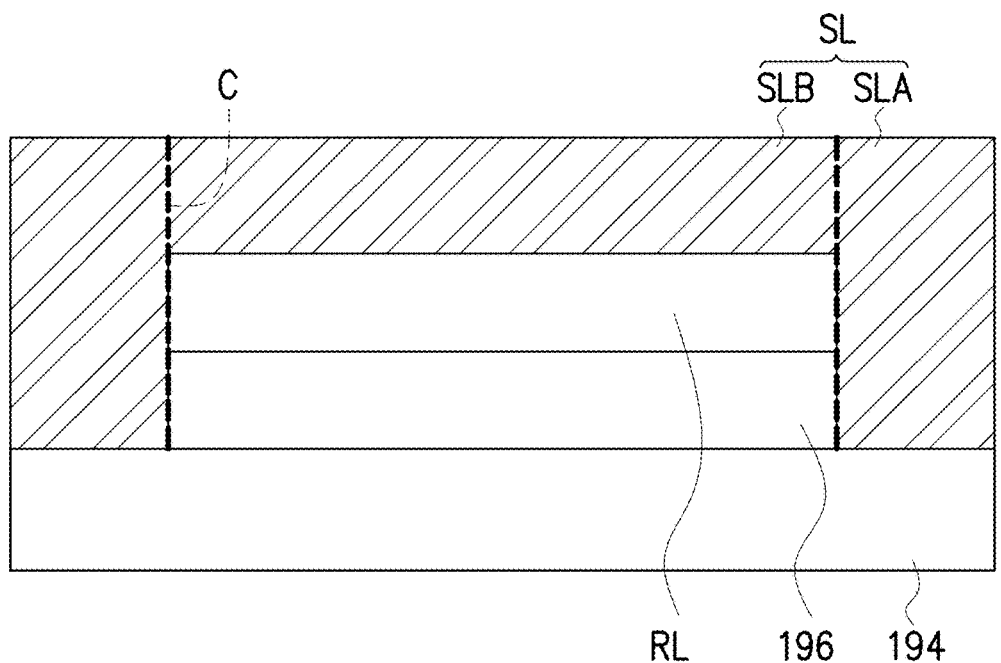
Figure 12G:
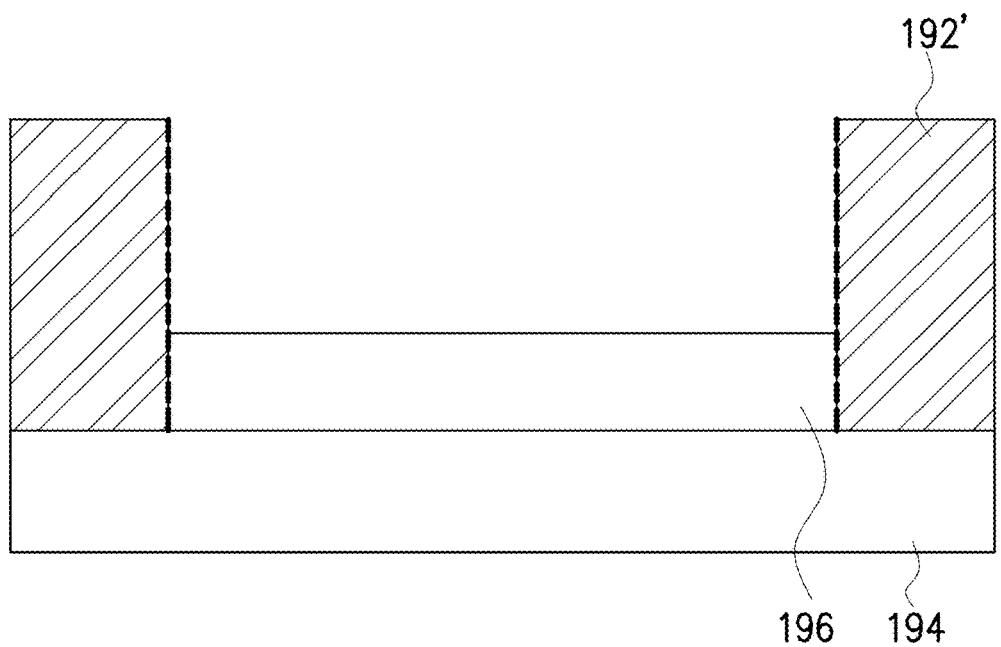

In the step of FIG. 12F, a trimming process may be performed to cut the sealant material layer SL along the contour of the release layer RL and the second adhesive layer 196 to separate the sealant predetermining portion SLA from the sacrificial portion SLB. At this time, the sealant predetermining portion SLA and the sacrificial portion SLB are separated by the cutting boundary C. Subsequently, the release layer RL and the sacrificial portion SLB of the sealant layer SL may be removed by using the release layer RL to obtain a structure as shown in FIG. 12G, which includes the sealant 192', the gas barrier substrate 194, and the second adhesive layer 196. After that, the structure of FIG. 12C and the structure of FIG. 12G are assembled, such that the light emitting unit EL, the first adhesive layer 160, and the heat shrinkable film 150 in FIG. 12C are accommodated in the space formed by the sealant 192' and the second adhesive layer 196. The light emitting device 1000 of FIG. 11 is completed.

In summary, in the light emitting device of the embodiment of the present disclosure, a heat shrinkable film is attached over the electrodes of the light emitting unit. When an abnormal point in the light emitting device generates and the temperature at the abnormal point increases, the thermal shrinkage of the heat shrinkable film can be caused. The second electrode of the light emitting unit may be deformed under the shrinkage stress of the heat shrinkable film and eventually become disconnected around the abnormal point to form an independent electrode pattern. The independent electrode pattern is electrically insulated from other parts of the electrode. Therefore, after the independent electrode pattern is formed, if the light emitting device continues to be energized, current can flow through the rest of the electrode without passing through the independent electrode pattern. Therefore, the independent electrode pattern is a part that loses the luminous efficacy and the other part of the electrode can emit light normally, thereby achieving the self-repairing ability.

Although the present disclosure has been disclosed by way of example above, it is not intended to limit the present disclosure. Any person of ordinary skill in the art can make some changes and changes without departing from the spirit and scope of the present disclosure. In the case of retouching, the scope of protection of the present disclosure shall be subject to the definition of the appended patent scope.

What is claimed is:

1. A light emitting device, comprising:
a substrate;
a first electrode disposed on the substrate;
a light emitting layer disposed on the first electrode;
a second electrode disposed on the light emitting layer, wherein the first electrode, the light emitting layer, and the second electrode are sequentially stacked on the substrate to constitute a light emitting unit;
a heat shrinkable film disposed on the light emitting unit;
a first adhesive layer disposed between the heat shrinkable film and the second electrode;
a gas barrier substrate, wherein the light emitting unit, the first adhesive layer and the heat shrinkable film are disposed between the substrate and the gas barrier substrate; and
a second adhesive layer disposed between the heat shrinkable film and the gas barrier substrate, wherein an adhesion strength between the second adhesive layer and the heat shrinkable film is smaller than an adhesion strength between the first adhesive layer and the heat shrinkable film.

2. The light emitting device of claim 1, wherein an adhesion strength between the light emitting layer and the second electrode is less than an adhesion strength between the first adhesive layer and the second electrode.

3. The light emitting device of claim 1, wherein the first adhesive layer directly contacts the second electrode and the heat shrinkable film.

4. The light emitting device of claim 1, wherein the heat shrinkable film covers the entire area of the second electrode.

5. The light emitting device of claim 1, wherein the heat shrinkable film is patterned to comprise a plurality of heat shrinkable film patterns, and orthographic projections of the heat shrinkable film patterns are within an area of the second electrode.

6. The light emitting device of claim 1, wherein the second electrode comprises an independent electrode pattern and an effective electrode portion separated by an electrode gap having a closed ring pattern.

7. The light emitting device of claim 6, wherein the independent electrode pattern is electrically isolated from the effective electrode portion, and an area where the independent electrode pattern is located is a luminescent failure region.

8. The light emitting device of claim 6, wherein a quantity of the independent electrode patterns is multiple.

9. The light emitting device of claim 6, wherein a peripheral of the independent electrode pattern has a coked light emitting layer.

10. The light emitting device of claim 6, wherein the independent electrode pattern is in contact with the first electrode.

11. The light emitting device of claim 6, wherein the heat shrinkable film comprises a shrinking pattern, and a perimeter of the shrinking pattern surrounds the independent electrode pattern.

12. The light emitting device of claim 11, wherein a radial length of the shrinking pattern is greater than a radial length of the independent electrode pattern.

13. The light emitting device of claim 11, wherein a quantity of the shrinking patterns is equal to a quantity of the independent electrode patterns, and the shrinking patterns correspond to the independent electrode patterns in a one to one correspondence.

14. The light emitting device of claim 1, wherein the light emitting unit further comprises an encapsulating layer disposed on the substrate, wherein the light emitting layer and the second electrode are encapsulated between the encapsulating layer and the substrate, and the heat shrinkable film is attached to the encapsulating layer through the first adhesive layer.

15. The light emitting device of claim 14, wherein the encapsulating layer encapsulates a side surface of the light emitting layer and a side surface of the second electrode.

16. The light emitting device of claim 14, further comprising a sealant, wherein the light emitting unit, the first adhesive layer and the heat shrinkable film are surrounded by the sealant.

17. The light emitting device of claim 16, wherein the sealant comprises an annular sealant portion surrounding the light emitting unit, the first adhesive layer, and the heat shrinkable film.

18. The light emitting device of claim 17, wherein the second adhesive layer is surrounded by the annular sealant portion.

19. The light emitting device of claim 1, wherein the second electrode comprises an effective electrode portion and a warped pattern, the effective electrode portion is in contact with the light emitting layer and the warped pattern is not in contact with the light emitting layer.

20. The light emitting device of claim 19, wherein the heat shrinkable film comprises a shrinking pattern, and an area of the shrinking pattern is laterally shifted with respective to an area of the warped pattern.

21. The light emitting device of claim 20, wherein the warped pattern is separated from the effective electrode portion via a break gap at a side of the warped pattern away from the shrinking pattern.

* * * * *